(12) United States Patent
Hembree et al.

(10) Patent No.: US 6,175,241 B1
(45) Date of Patent: Jan. 16, 2001

(54) TEST CARRIER WITH DECOUPLING CAPACITORS FOR TESTING SEMICONDUCTOR COMPONENTS

(75) Inventors: David R. Hembree; Salman Akram, both of Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/253,578

(22) Filed: Feb. 19, 1999

(51) Int. Cl.[7] ............................. G01R 31/02; G01R 31/26
(52) U.S. Cl. ..................... 324/755; 324/754; 324/760; 324/765
(58) Field of Search ................................... 324/755, 754, 324/761, 765, 760

(56) References Cited

U.S. PATENT DOCUMENTS

| | | | |
|---|---|---|---|
| 5,043,533 | 8/1991 | Spielberger | 174/52.4 |
| 5,103,283 | 4/1992 | Hite | 357/51 |
| 5,272,590 | 12/1993 | Hernandez | 361/306.2 |
| 5,367,253 | 11/1994 | Wood et al. | 324/158.1 |
| 5,495,179 | 2/1996 | Wood et al. | 324/755 |
| 5,519,332 | * 5/1996 | Wood et al. | 324/755 |
| 5,541,525 | 7/1996 | Wood et al. | 324/755 |
| 5,578,934 | 11/1996 | Wood et al. | 324/758 |
| 5,592,736 | 1/1997 | Akram et al. | 29/842 |
| 5,672,981 | * 9/1997 | Fehrman | 324/760 |
| 5,691,649 | 11/1997 | Farnworth et al. | 324/755 |
| 5,734,270 | * 3/1998 | Buchanan | 324/754 |
| 5,783,461 | 7/1998 | Hembree | 438/17 |
| 5,834,945 | 11/1998 | Akram et al. | 324/755 |
| 5,844,418 | 12/1998 | Wood et al. | 324/755 |
| 5,844,419 | 12/1998 | Akram et al. | 324/755 |
| 5,878,485 | 3/1999 | Wood et al. . | |
| 5,896,036 | 4/1999 | Wood et al. . | |
| 5,929,647 | 7/1999 | Akram et al. . | |
| 5,982,185 | 11/1999 | Farnworth . | |
| 6,016,060 | 1/2000 | Akram et al. . | |
| 6,018,249 | 1/2000 | Akram et al. . | |
| 6,025,728 | 2/2000 | Hembree et al. . | |
| 6,040,702 | 3/2000 | Hembree et al. . | |
| 6,060,894 | 5/2000 | Hembree et al. . | |
| 6,072,326 | 6/2000 | Akram et al. . | |
| 6,091,251 | 7/2000 | Wood et al. . | |
| 6,091,252 | 7/2000 | Akram et al. . | |
| 6,094,058 | 7/2000 | Hembree et al. . | |

OTHER PUBLICATIONS

AVX Corporation technical brochure, "Mini–Ceramic Capacitor" and "Glass Composite Capacitors", Jan. 1998.

* cited by examiner

Primary Examiner—Safet Metjahic
Assistant Examiner—Anjan K Deb
(74) Attorney, Agent, or Firm—Stephen A. Gratton (57) ABSTRACT

A test carrier for testing a semiconductor component includes at least one decoupling capacitor for reducing parasitic inductance and noise in test signals transmitted to the component. The carrier includes a base, an interconnect for making temporary electrical connections with the component, and a force applying mechanism for biasing the component against the interconnect. The decoupling capacitor can be mounted to the base, or to the interconnect, with electrodes of the capacitor contained in power and ground paths to the component. A test method includes the steps of providing the carrier with the decoupling capacitor, assembling the component in the carrier, and transmitting test signals through the decoupling capacitor to the component. A test system includes the test carrier, a test apparatus such as a test board, and test circuitry for generating and analyzing test signals.

41 Claims, 7 Drawing Sheets

TEST CARRIER WITH DECOUPLING CAPACITORS FOR TESTING SEMICONDUCTOR COMPONENTS

FIELD OF THE INVENTION

This invention relates generally to semiconductor manufacture and testing. More particularly, this invention relates to a test carrier, a test method and a test system for testing semiconductor components.

BACKGROUND OF THE INVENTION

Semiconductor components must be tested following the fabrication process. For testing small, thin components, such as bare dice and chip scale packages, test carriers can be utilized to temporarily package the components. One type of test is referred to as burn-in and involves heating a component for several hours while test signals are applied to integrated circuits on the component. This type of test carrier is disclosed in U.S. Pat. Nos. 5,519,332; 5,541,525; 5,495,179; 5,440,240; and 5,408,190 to Wood et al.

Typically the component being tested includes external contacts, such as bond pads on bare dice, or ball grid array (BGA) solder balls on chip scale packages. An interconnect component of the test carrier includes contacts for establishing temporary electrical connections with the external contacts on the component.

The test carrier also includes a base with terminal contacts that electrically connect to a test apparatus such as a test socket or test board. The test apparatus is in electrical communication with test circuitry configured to transmit test signals to the integrated circuits. During assembly of the carrier, separate electrical paths are formed between the terminal contacts on the base, and the contacts on the interconnect. One method for making these electrical paths is by forming the base and interconnect with metal conductors, and then wire bonding the conductors on the base, to conductors on the interconnect.

One aspect of these carrier is that the external contacts on semiconductor components are becoming smaller and more closely spaced. Accordingly, the electrical paths through the test carriers to the components are becoming more closely spaced. Also signal transmission speeds through the electrical paths are increasing. For example, some integrated circuits operate at clocking speeds of 500 mhz or more and must be tested at these speeds.

One problem occurring during testing at high speeds is referred to as "parasitic inductance". For example, parasitic inductance can result from switching transients and cross coupling between the conductors on the base or interconnect of the test carrier. Parasitic inductance can also result from cross coupling of the bond wires between the interconnect and base. The parasitic inductance can cause spurious signals and a drop or modulation in the power supply voltage, that is sometimes referred to as power supply noise. Parasitic inductance, and the resultant spurious signals and power supply noise, can degrade the operation of the semiconductor component and adversely affect the test results.

The test circuitry typically includes decoupling capacitors to help alleviate parasitic inductance generated within the test circuitry. However, parasitic inductance can also occur in the electrical paths between the test circuitry and the test carrier. For example parasitic inductance can occur in the test socket or test board.

Another prior art method for reducing parasitic inductance and power supply noise is by mounting decoupling capacitors directly to the test socket. For example, semiconductor devices packaged in conventional packages, such as small outline j-lead packages (SOJs), or dual in-line packages (DIPs), are typically tested by insertion into sockets on the test board. For reducing parasitic inductance during testing, a thin film capacitor can be mounted between the socket and the semiconductor package. U.S. Pat. No. 5,844,419 to Akram et al., discloses a thin film capacitor configured for mounting to a test socket in direct electrical contact with the power and ground leads for the package.

Similarly, a thin film capacitor could be configured for insertion between the test board, and a test carrier for testing bare dice and chip scale packages. However, parasitic inductances can still arise within the test carrier. The present invention is directed to a test carrier which addresses the problem of parasitic inductance occurring within the test carrier.

SUMMARY OF THE INVENTION

In accordance with the present invention, an improved test carrier, test method, and test system for testing semiconductor components are provided. The test carrier can be used to temporarily package a semiconductor component, such as a bare die or chip scale package, for performing test procedures such as burn-in.

The test carrier includes a base for retaining the component, an interconnect for electrically contacting the component, and a force applying mechanism for biasing the component against the interconnect. The base includes terminal contacts, such as metal pins or balls, for electrically engaging mating electrical connectors on a test apparatus, such as a burn-in board. The interconnect includes interconnect contacts for electrically engaging external contacts on the component. In addition, conductors and bond pads on the base are wire bonded to conductors and bond pads on the interconnect to form separate electrical paths between the terminal contacts on the base, and the interconnect contacts.

The test carrier also includes at least one decoupling capacitor electrically connected to power (Vcc) and ground (Vss) paths through the carrier to the component. In a first carrier embodiment the capacitor is mounted within a recess formed in the base. In addition, the capacitor includes a first electrode electrically connected to a power terminal contact on the base, and a second electrode electrically connected to a ground terminal contact on the base. The first electrode is also electrically connected to an interconnect contact which electrically engages a power external contact on the component. Similarly, the second electrode is electrically connected to an interconnect contact which electrically engages a ground external contact on the component.

Electrical communication with the capacitor can be accomplished by soldering, wire bonding, TAB bonding, or conductive adhesive bonding the capacitor electrodes to pads on the base. In addition, an encapsulant, such as a curable polymer, can be formed in the recess to encapsulate and seal the capacitor. Alternately, the encapsulant can be omitted, and the base constructed with a capacitor socket for mounting the capacitor. The capacitor socket permits the base to be easily reconfigured with different capacitors for testing different types of components, or for performing different types of test procedures.

A second embodiment test carrier includes a lead frame molded to the base which forms internal conductors and terminal contacts for the carrier. During assembly of the test carrier, the decoupling capacitor is attached to the lead frame, and the lead frame and capacitor are molded into the base. A third embodiment test carrier includes a decoupling capacitor mounted to the interconnect rather than to the base. In this embodiment the capacitor can comprise a thin film capacitor, or alternately a surface mounted capacitor.

The test method includes the steps of: providing a test carrier comprising a decoupling capacitor contained in power and ground paths through the test carrier; assembling the test carrier with a semiconductor component therein; mounting the test carrier to a test apparatus; and then applying test signals through the test carrier to the component. During applying of the test signals, the capacitor reduces parasitic inductance and power supply noise transmitted to the component. In addition, electrical characteristics of the capacitor can be selected to optimize a particular test procedure, or testing of a particular component.

The test system includes the test carrier, a test apparatus for applying test signals to the test carrier, and test circuitry in electrical communication with the test apparatus for generating and analyzing the test signals. The test system applies test signals through the test apparatus, and through the test carrier to the component.

DETAILED DESCRIPTION OF THE INVENTION

Figure 1:
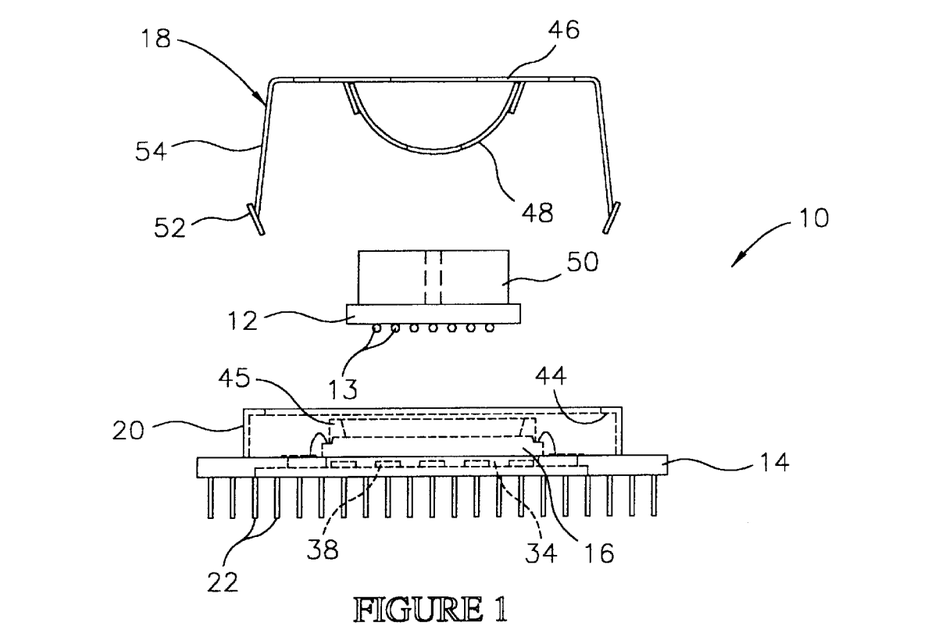
FIG. 1 is an exploded side elevation view of a test carrier constructed in accordance with the invention.
Figure 2:
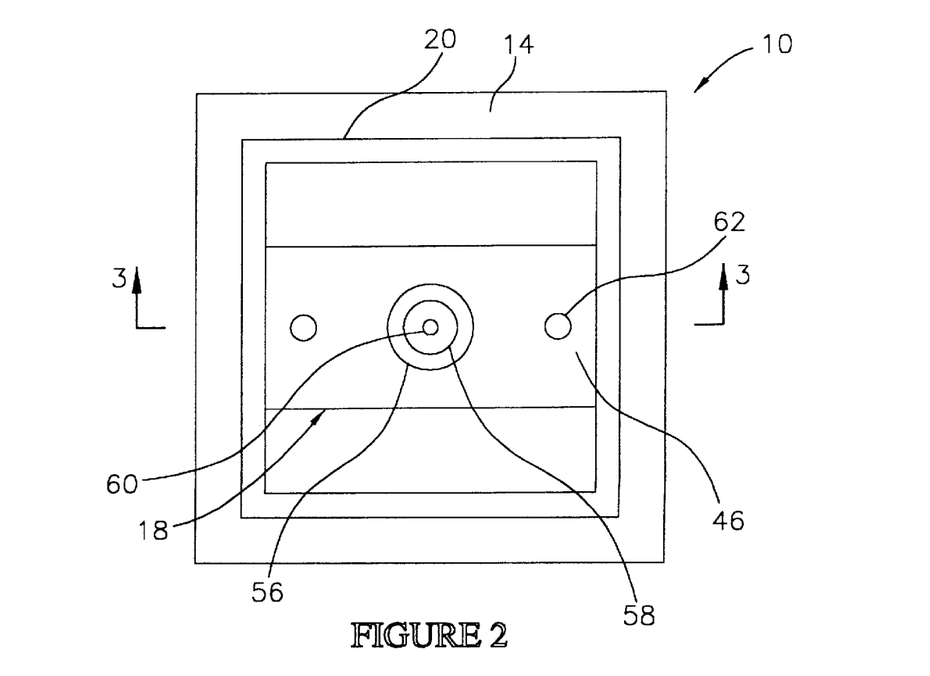
FIG. 2 is a plan view of the test carrier of FIG. 1.
Figure 3:
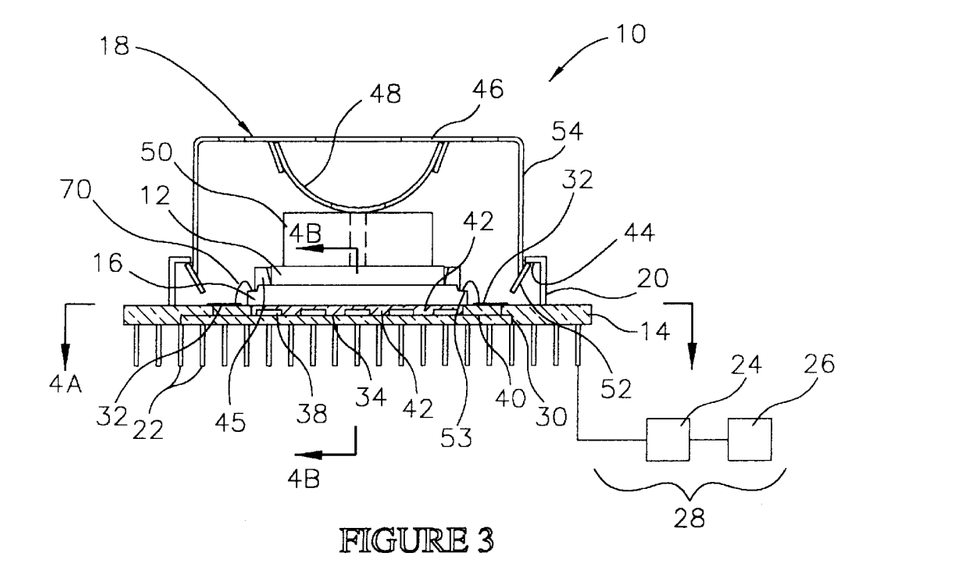
FIG. 3 is a schematic diagram of a test system constructed in accordance with the invention including a cross sectional view of the test carrier taken along line 3—3 of FIG. 2.

Referring to FIGS. 1–3, a test carrier 10 constructed in accordance with the invention is illustrated. The carrier 10 is adapted to temporarily package a semiconductor component 12 (FIG. 3) for testing and burn-in. In the embodiment illustrated in FIGS. 1–3, the component 12 comprises a chip scale package and includes external contacts 13 (FIG. 4B) in electrical communication with integrated circuits contained on the component 12. The external contacts 13 comprise solder balls arranged in a ball grid array, as is conventional with chip scale packages, BGA packages, and bumped bare dice. As will be further explained, the test carrier 10 can also be constructed to test components having planar external contacts, such as thin film bond pads on a bare die.

The carrier 10, broadly stated, comprises: a base 14 for retaining the component 12; an interconnect 16 for making temporary electrical connections with the component 12; a force applying mechanism 18 for biasing the component 12 against the interconnect 16; and a clamp ring 20 on the base 14 for attaching the force applying mechanism 18 to the base 14. The structure and function of these components will become more apparent as the description proceeds.

The base 14 provides a support structure for the other elements of the carrier 10. In addition, the base 14 in cooperation with the force applying mechanism 18, houses and retains the component 10. In the embodiment of FIGS. 1–3, the base 14 comprises a laminated ceramic material. A ceramic lamination process can be used to fabricate the base 14 with a desired geometry, and with metal features, such as internal conductors and external pads. U.S. Pat. No. 5,519,332 entitled "CARRIER FOR TESTING AN UNPACKAGED SEMICONDUCTOR DIE", which is incorporated herein by reference, describes a ceramic lamination process for fabricating the base 14.

Alternately, rather than ceramic, the base 14 can comprise plastic and the metal features formed using a 3-D molding process. U.S. patent application Ser. No. 08/615,119, filed Mar. 13, 1996 now U.S. Pat. No. 5,878,485, entitled "CARRIER FOR TESTING AN UNPACKAGED SEMICONDUCTOR DIE", which is incorporated herein by reference, describes a 3-D molding process for fabricating the base 14.

Rather than ceramic or plastic, the base 14 can also comprise a glass reinforced plastic (e.g., FR-4) similar to materials used for circuit boards. In this case, conventional plastic substrate fabrication processes, as described in *Ball Grid Array Technology*, by John H. Lau, McGraw-Hill, Inc., 1995, can be used for fabricating the base 14.

As shown in FIG. 3, the terminal contacts 22 on the base 14 are adapted for electrical communication with a test apparatus 24 and test circuitry 26. The test apparatus 24 comprises a test socket or a test board, such as a burn-in board. The test circuitry 26 generates test signals, and transmits the test signals through the test apparatus 24 to the terminal contacts 22 to the component 12. The test circuitry 26 also analyzes test signals transmitted from the component 12 to the test circuitry 26. The carrier 10, test apparatus 24 and test circuitry 26 form a test system 28 which permits various electrical characteristics of the component 12 to be evaluated.

In the illustrative embodiment, the terminal contacts 22 on the base 14 comprise pins formed in a pin grid array (PGA) on a backside of the base 14. Alternately, other configurations for the terminal contacts 22 can be provided. For example, the carrier base 14 can include ball contacts in a ball grid array (BGA), or fine ball grid array (FBGA). As will be further explained, the terminal contacts 22 can also comprise pins in other configurations such as j-bend, or butt joint configurations.

As shown in FIG. 3, the base 14 also includes terminal conductors 30 in electrical communication with selected terminal contacts 22 and with bond pads 32 on the base 14. The terminal conductors 30 can include internal portions formed within the structure of the base 14 and also external portions formed on exposed surfaces of the base 14. The internal portions of the terminal conductors 30 can be formed using processes such as via filling, lamination and molding. The external portions of the terminal conductors 30 can be formed using a metallization process such as deposition, photopatterning and etching.

As also shown in FIG. 3, the base 14 includes a recess 34 wherein one or more decoupling capacitors 38 are mounted. The decoupling capacitors 38 are in electrical communication with selected terminal contacts 22, and with selected bond pads 32 on the base 32. As will be further explained, the decoupling capacitors 38 can be placed in ground and electrical paths through the base 32 to filter noise during test procedures conducted using the carrier 10.

In the illustrative embodiment, the recess 34 includes one or more capacitor pads 36A, 36B (FIG. 4A) configured for direct mounting of the decoupling capacitors 38 to the base 14 by soldering or conductive adhesive bonding. Alternately as will be further explained the capacitors 38 can be electrically connected to the base by wire bonding, TAB bonding or socketing.

Figure 4A:
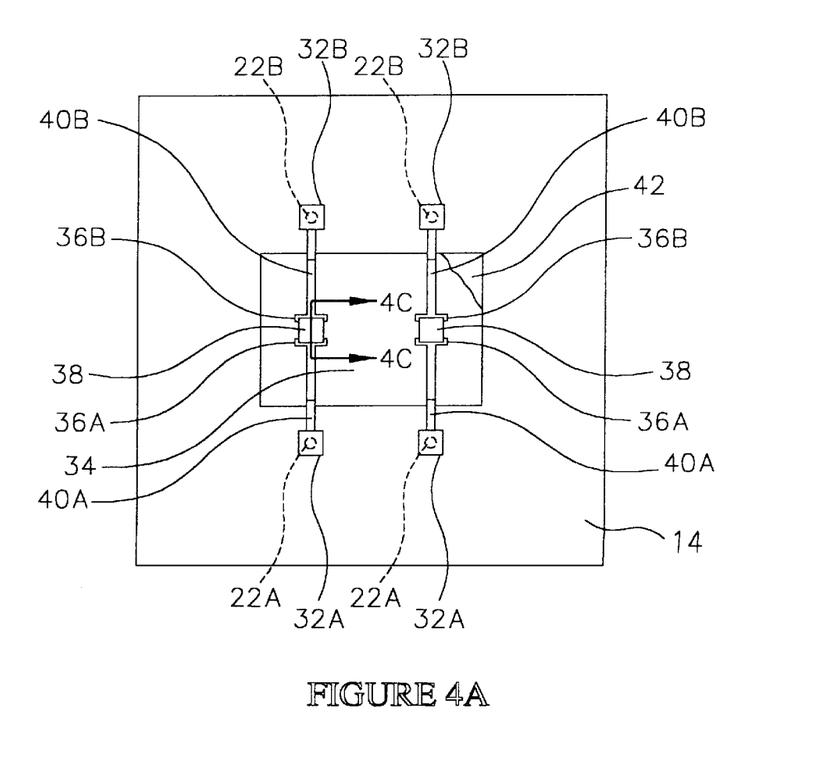
FIG. 4A is a schematic cross sectional view of the test carrier with parts removed taken along section line 4A—4A of FIG. 3.

The base 14 also includes capacitor conductors 40 for electrically connecting the capacitor pads 36A, 36B to selected terminal contacts 22, and to selected bond pads 32 on the base 14. As with the terminal conductors 30, the capacitor conductors 40 can include internal portions formed within the structure of the base 14, and exposed portions formed on surfaces of the base 14.

Still referring to FIG. 3, the base 14 also includes an encapsulant 42 formed within the recess 34 for encapsulating and sealing the decoupling capacitors 38. The encapsulant 42 comprises a curable polymer such as an epoxy, polyimide, or room temperature vulcanizing material (RTV). During fabrication of the carrier 10, the curable polymer can be deposited within the recess 34 in viscous form and then cured as required.

As will be further explained, the base 14 can also comprise a molded plastic material such as a thermoplastic plastic, a thermosetting plastic, or a liquid crystal polymer. With the base 14 comprising plastic, the decoupling capacitors 38 can be molded within the plastic structure of the base 14. In a similar manner, with the base 14 comprising ceramic, the decoupling capacitors can be contained within the structure of the ceramic layers.

Referring to FIG. 4A, the mounting of the decoupling capacitors 38 to the base 14 is schematically illustrated. For simplicity only two decoupling capacitors 38 are illustrated. Each decoupling capacitor 38 has an associated pair of capacitor pads 36A, 36B formed on the base 14. A first capacitor pad 36A is in electrical communication with a capacitor conductor 40A. The capacitor conductor 40A is in electrical communication with a selected terminal contact 22A and with a selected bond pad 32A on the base 14. A second capacitor pad 36B is in electrical communication with a capacitor conductor 40B. The capacitor conductor 40B is in electrical communication with a selected terminal contact 22B, and with a selected bond pad 32B on the base 14.

Figure 4B:
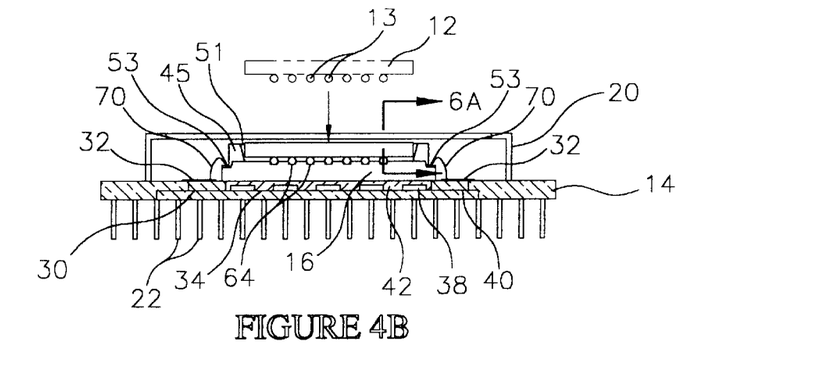
FIG. 4B is a schematic cross sectional view of the test carrier with parts removed taken along section line 4B—4B of FIG. 3.
Figure 4C:
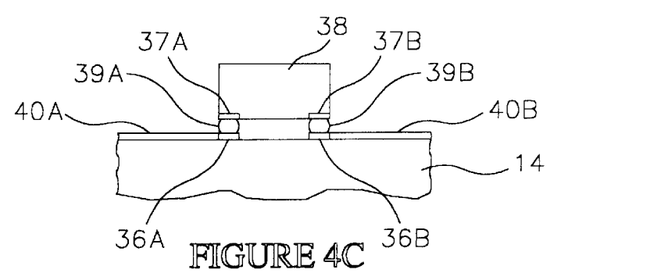
FIG. 4C is an enlarged schematic cross sectional view taken along section line 4C—4C of FIG. 4A illustrating mounting of a decoupling capacitor to a base of the test carrier by soldering or conductive adhesive bonding.

As shown in FIG. 4C, the capacitor 38 can be surface mounted to the capacitor pads 36A, 36B. A first conductive bump 39A electrically connects a first electrode 37A of the capacitor 38 to the first capacitor pad 36A on the base 14. A second conductive bump 39B electrically connects a second electrode 37B of the capacitor 38 to the second capacitor pad 36A on the base 14. The conductive bumps 39A, 39B can comprise solder bumps bonded to the electrodes 37A, 37B, and pads 36A, 36B, using solder reflow or other suitable soldering process. Alternately, the conductive bumps 39A, 39B can comprise a conductive adhesive layer, such as an isotropic or anisotropic adhesive, deposited in viscous form and then cured as required.

Figure 4D:
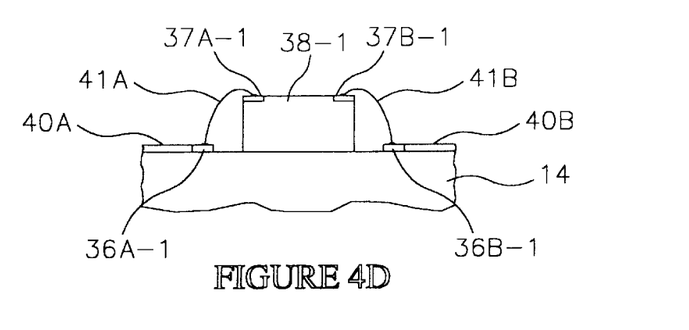
FIG. 4D is an enlarged schematic cross sectional view equivalent to FIG. 4C illustrating an alternate embodiment decoupling capacitor wire bonded or TAB bonded to the base.

Alternately, as shown in FIG. 4D, a capacitor 38-1 can be wire bonded, or TAB bonded to the base 14. In particular wire 41A (or TAB tape) is bonded to a first electrode 37A-1 on the capacitor 38-1, and to a first capacitor pad 36A-1 on the base 14. Similarly, a wire 41B (or TAB tape) is bonded to a second electrode 37B-1 on the capacitor 38-1, and to a second capacitor pad 36B-2 on the base 14.

Figure 4E:
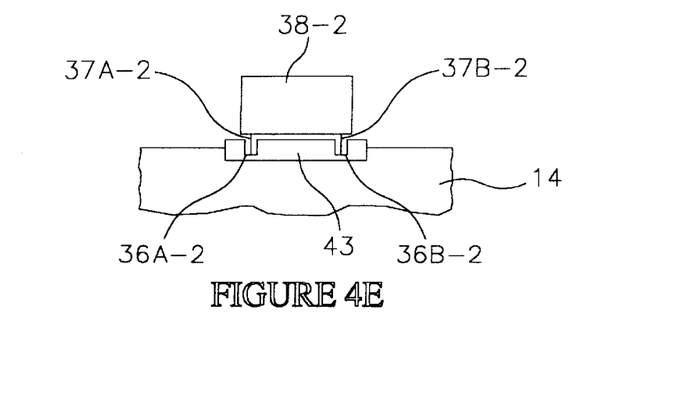
FIG. 4E is an enlarged schematic cross sectional view equivalent to FIG. 4C illustrating an alternate embodiment decoupling capacitor mounted to a socket on the base.

Alternately, as shown in FIG. 4E, the base 14 can include a socket 43 for electrically mounting a capacitor 38-2 to the base 14. The socket 43 includes a first receptacle 36A-2 for electrically engaging a first electrode 37A-2 on the capacitor 38-2, and a second receptacle 36B-2 for electrically engaging a second electrode 37B-2 on the capacitor 38-2. The receptacles 36A-2, 36B-2 are in electrical communication with selected capacitor conductors 40 on the base 14, substantially as previously described.

Referring to FIG. 4B, further details of the base 14 and interconnect 16 are illustrated. The interconnect 16 can be adhesively bonded to the base 14 and to the encapsulant 42 or merely placed thereon. The interconnect 16 includes interconnect contacts 64 configured for forming temporary electrical connections with the external contacts 13 on the component 12. Further details of the interconnect contacts 64 will be hereinafter described. The interconnect 16 also includes conductors 47 in electrical communication with the interconnect contacts 64. In addition, the interconnect 16 includes bond pads 53 in electrical communication with the conductors 47 and interconnect contacts 64.

The interconnect 16 also includes an alignment member 45 for aligning the component 12 to the interconnect 16, such that the external contacts 13 on the component 12 electrically engage the interconnect contacts 64. The alignment member 45 can comprise silicon, ceramic, plastic, FR-4, or a light sensitive polymer. The alignment member 45 includes an alignment opening 51 having a peripheral outline that is slightly larger than a peripheral outline of the component 12. The alignment opening 51 includes sloped sidewalls (ar alternately straight sidewalls), adapted to contact the outside edges of the component 12, to guide the component 12 onto the interconnect 16. In FIG. 4B, the alignment member 45 is illustrated as being attached to the interconnect 16. However, the alignment member 45 can also be attached to the base 14, or formed integrally therewith. A suitable method for forming a silicon alignment member is described in U.S. Pat. No. 5,559,444, entitled "METHOD AND APPARATUS FOR TESTING UNPACKAGED SEMICONDUCTOR DICE", incorporated herein by reference. As will be further explained the alignment member 45 can also be eliminated and alignment performed using optical alignment techniques.

As also shown in FIG. 4B, bond wires 70 are wire bonded to the bond pads 32 on the base 14 and to the bond pads 53 on the interconnect 16. The bond wires 70 complete the electrical paths between the interconnect contacts 64 and the decoupling capacitors 38. In addition, the bond wires 70 complete the electrical paths between the interconnect contacts 64 and the terminal contacts 22 on the base 14.

Figure 5:
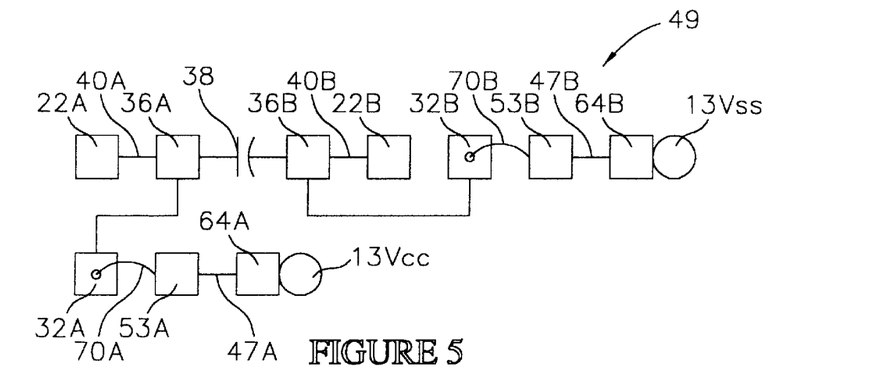
FIG. 5 is an electrical schematic illustrating an electrical path through the test carrier that includes the decoupling capacitor.

Referring to FIG. 5, an electrical circuit 49 in the base 14 that includes the decoupling capacitor 38 is illustrated. The component 12 includes a power external contact 13Vcc which provides a power plane for the component 12. In addition, the component 12 includes a ground external contacts 13Vss which provides a ground plane for the component 12. The decoupling capacitor 38 is electrically connected to both the power external contact 13Vcc and to the ground external contact 13Vss on the component 12.

In the electrical circuit 49 the first electrode of the capacitor 38 is electrically connected to the first capacitor pad 36A on the base 14. The first capacitor pad 36A is in electrical communication with the capacitor conductor 40A and with a terminal contact 22A on the base 14. In addition, the first capacitor pad 36A is in electrical communication with a bond pad 32A on the base 14, a bond wire 70A, a bond pad 53A on the interconnect 16, an interconnect conductor 47A, and an interconnect contact 64A which electrically contacts the power external contact 13Vcc. The second capacitor pad 36B is in electrical communication with the capacitor conductor 40B and with a terminal contact 22B on the base 14. In addition, the second capacitor pad 36B is in electrical communication with a bond pad 32B on the base 14, a bond wire 70B, a bond pad 53B on the interconnect 16, an interconnect conductor 47B, and an interconnect contact 64B which electrically contacts the ground external contact 13Vss.

The values of the decoupling capacitors 38 are selected based upon the particular semiconductor component 12 being tested, and the test parameters being applied to the semiconductor component 12. Nominal values for the decoupling capacitors 38 are in the range of 1 picofarad ($10^{-12}$ Farad) to 1 microfarad ($10^{-6}$ Farad). With the embodiment of FIG. 4E, the capacitors 38 can be easily replaced using the capacitor socket 43, to optimize performance of a particular test procedure. Suitable decoupling capacitors 38 are commercially available from AVX of Myrtle Beach S.C.

Figure 6A:
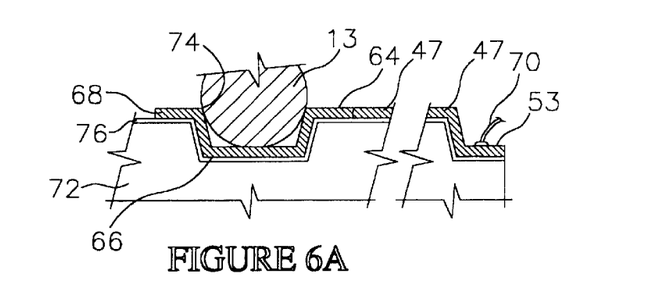
FIG. 6A is an enlarged schematic cross sectional view, taken along 6A—6A of FIG. 4B, illustrating a contact on the interconnect engaging a contact on the component.

Referring to FIG. 6A, an interconnect contact 64 is shown electrically engaging an external contact 13 on the component 12. The interconnect contact 64 can be formed integrally with a substrate 72 of the interconnect 16. Preferably, the substrate 72 comprises silicon, such that a coefficient of thermal expansion (CTE) of the interconnect 16 matches that of the semiconductor component 12, which typically comprises silicon. Alternately, germanium, a reinforced glass resin material, or a ceramic material, can be used as the substrate material.

The interconnect contact 64, broadly stated, comprises: a pocket 66 in the interconnect substrate 72; a conductive layer 68 on the pocket 66; and an insulating layer 76 between the substrate 72 and the conductive layer 68. One method for forming the pocket 66 is by forming a mask (not shown) on the interconnect substrate 72, such as a photopatterned resist mask, and then etching the interconnect substrate 72 through openings in the mask, using an etchant. With the interconnect substrate 72 comprising silicon, a suitable etchant for performing the etch process comprises a solution of KOH.

The pocket 66 is sized and shaped to retain and electrically engage a single external contact 13. A representative diameter, or width, of the pocket 66 can be from 2 mils to 50 mils or more. This diameter can be less than a diameter of the external contact 13 so that only portions thereof will be contacted. A depth of the pocket 66 can be equal to or less than the diameter of the pocket 66. A pitch or spacing of the pocket 66 relative to adjacent pockets 66 will exactly match a pitch of the contact balls 13.

The conductive layer 68 can comprise a layer of a highly conductive metal such as aluminum, titanium, nickel, iridium, copper, gold, tungsten, silver, platinum, palladium, tantalum, molybdenum or alloys of these metals. The conductive layer 68 can be formed on the insulating layer 76 to a desired thickness using a suitable metallization process (e.g., CVD, photopatterning, etching). Peripheral edges 74 of the conductive layer 68 are adapted to penetrate native oxide layers on the contact balls 13 to contact the underlying metal.

As also shown in FIG. 6A, the conductive layer 68 is in electrical communication with a selected conductor 47 and bond pad 53 on the interconnect substrate 72. Bond wire 70 electrically connects the bond pad 53 to a corresponding bond pad 36 on the base 14 and to a selected terminal contact 22 on the base 14. The conductive layers 68 and conductors 47 can be formed using a same metallization process, or using different metallization processes. In addition, the conductive layers 68 and conductors 47 can be formed as multi-layered stacks of metals (e.g., bonding layer/barrier layer). Still further, the conductors 47 can be electrically insulated with an outer insulating layer (not shown).

Further details of the interconnect contact 64 are described in U.S. patent application Ser. No. 08/829,193, filed Mar. 31, 1997, entitled "INTERCONNECT HAVING RECESSED CONTACT MEMBERS WITH PENETRATING BLADES FOR TESTING SEMICONDUCTOR DICE AND PACKAGES WITH CONTACT BUMPS", which is incorporated herein by reference.

Figure 6B:
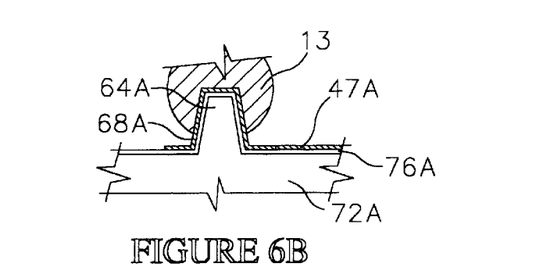
FIG. 6B is an enlarged schematic cross sectional view, equivalent to FIG. 6A, of an alternate embodiment interconnect contact.

Referring to FIG. 6B, a second embodiment interconnect contact 64A comprises a projection formed integrally with a substrate 72A, which preferably comprises silicon or other etchable material. One method for forming the interconnect contact 64A is by etching the substrate 72A as described in U.S. Pat. No. 5,483,741, entitled "METHOD FOR FABRICATING A SELF LIMITING SILICON BASED INTERCONNECT FOR TESTING BARE SEMICONDUCTOR DICE", which is incorporated herein by reference. The interconnect contact 64A includes a conductive layer 68A formed using a metallization process as previously described. The conductive layer 68A is in electrical communication with a selected conductor 47A on the substrate 72A. In addition, an insulating layer 76A can be formed on the substrate 72A to electrically insulate the conductive layer 68A.

The interconnect contact 64A is adapted to penetrate into the external contact 13 to form an electrical connection therewith. In FIG. 6B, the interconnect contact 64A is shown as penetrating a center of the external contact 13, forming a void therein. However, penetration can be along the peripheral edges of the external contact 13 in which case a groove would be formed.

Figure 6C:
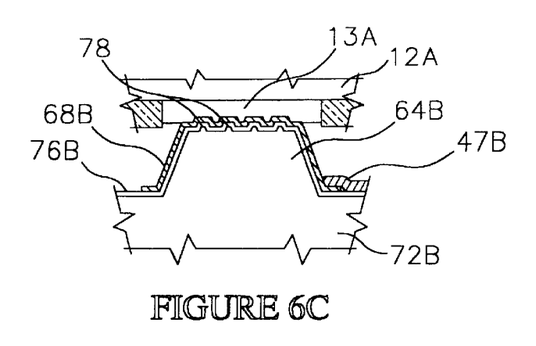
FIG. 6C is an enlarged schematic cross sectional view equivalent to FIG. 6A of another alternate embodiment interconnect contact.

Referring to FIG. 6C, a third embodiment interconnect contact 64B is adapted to electrically engage a component 12A, such as a bare die, having a planar contact 13A, such as a thin film bond pad. The interconnect contact 64B comprises a projection formed integrally with a substrate 72B. The interconnect contact 64B also includes penetrating projections 78 configured to penetrate the planar contact 13A to a limited penetration depth. In addition, the interconnect contact 64B includes a conductive layer 68B in electrical communication with a conductor 47B on the substrate 72B, and an insulating layer 76B for electrically insulating the conductive layer 68B. Further details of the interconnect contact 64B are described in U.S. Pat. No. 5,686,317, entitled "METHOD FOR FORMING AN INTERCONNECT HAVING A PENETRATION LIMITED CONTACT STRUCTURE FOR ESTABLISHING TEMPORARY ELECTRICAL COMMUNICATION WITH A SEMICONDUCTOR DIE", which is incorporated herein by reference.

In each of the above embodiments the contact balls 13 (or planar contact 13A) can be aligned with the interconnect contacts 64 using the alignment member 45 (FIG. 4B). Alternately, an optical alignment technique as described in U.S. Pat. No. 5,796,264 which is incorporated herein by reference, can be used.

Referring again to FIGS. 1–3, the base 14 also includes a clamp ring 20 for attaching the force applying mechanism 18 to the base 14 during assembly of the carrier 10. The clamp ring 20 is attached to the base 14 and has a frame-like configuration. As shown in FIG. 3, the clamp ring includes grooves 44 wherein the force applying mechanism 18 is attached. In the illustrative embodiment, the clamp ring comprises metal, and is attached to the base 14 using a brazing process. One suitable metal for the clamp ring 20 comprises tungsten coated with gold. The base 14 can include bonding features, such as metal pads for attaching the clamp ring 20.

The force applying mechanism 18 comprises a clamp 46, a biasing member 48, and a pressure plate 50. The clamp 46 comprises a flexible bridge-like structure formed of a resilient material such as steel. The clamp 46 includes opposed sides 54 movable towards one another. The clamp 46 also includes tabs 52 that physically engage the grooves 44 of the clamp ring 20. Additionally, the clamp 56 includes an opening 56 which provides access to the component 12 for a vacuum assembly tool during assembly of the test carrier 10. The biasing member 48 also includes an opening 58, and the pressure plate 50 includes an opening 60 for the vacuum assembly tool. A pair of openings 62 (FIG. 2) can also be provided on the clamp 46 for manipulation of the clamp 46 by a vacuum assembly tool during assembly of the carrier.

In the illustrative embodiment, the biasing member 48 is made of a resilient spring material such as steel, and as shown in FIG. 3, has a generally bow or leaf spring shape. The biasing member 48 can also comprise a elastomeric block. U.S. patent application Ser. No. 08/899,433 filed Dec. 13, 1997 entitled "TEST SYSTEM WITH MECHANICAL ALIGNMENT FOR SEMICONDUCTOR CHIP SCALE PACKAGES AND DICE", which is incorporated herein by reference, describes an exemplary example of an elastomeric block biasing member. Also for some applications the pressure plate 50 can be eliminated when the force applying mechanism 18 includes an elastomeric block biasing member.

Figure 7:
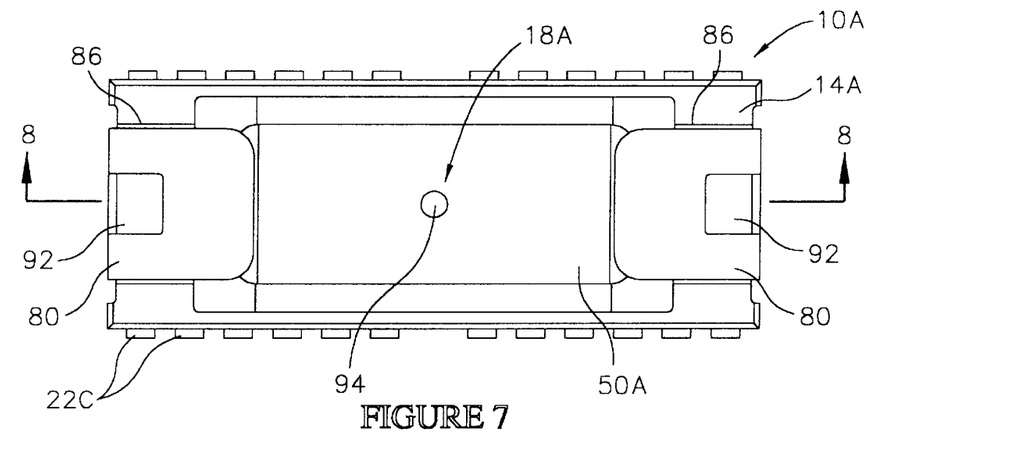
FIG. 7 is a plan view of an alternate embodiment test carrier constructed in accordance with the invention.
Figure 8:
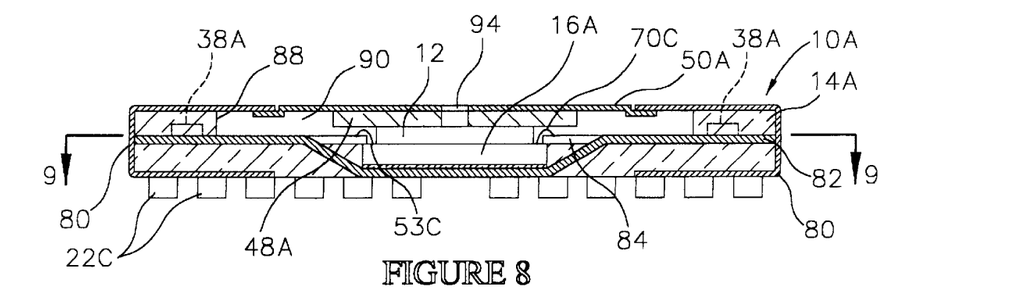
FIG. 8 is a cross sectional view taken along section line 8—8 of FIG. 7.
Figure 9:
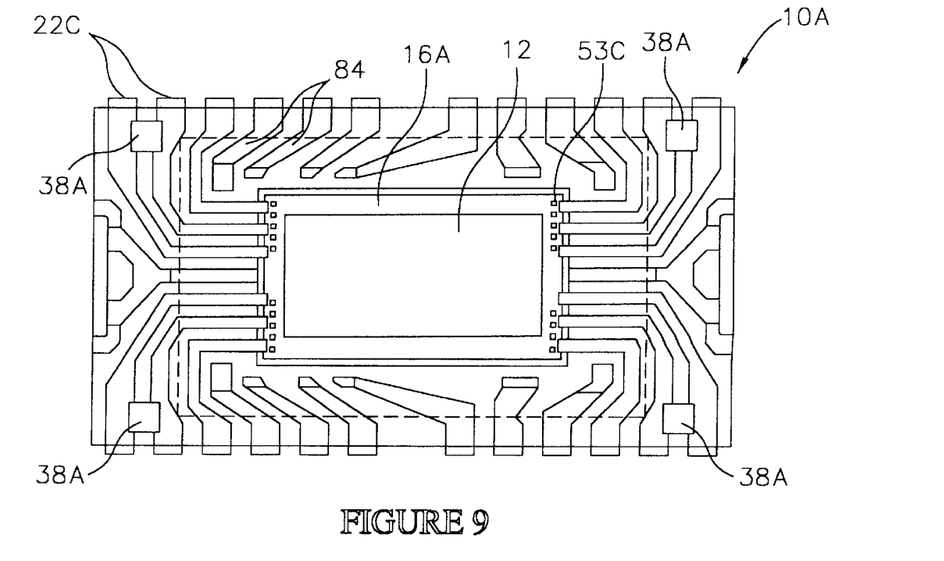
FIG. 9 is a cross sectional view taken along section line 9—9 of FIG. 8.

Referring to FIGS. 7–9, an alternate embodiment test carrier 10A is illustrated. The carrier 10A includes a molded plastic base 14A, and an interconnect 16A. The carrier 10A also includes a force applying mechanism 18A comprising a biasing member 48A (FIG. 8), a pressure plate 50A and a pair of clips 80. In addition, the carrier 10A includes a plurality of terminal contacts 22C in electrical communication with the interconnect 16A. In general, the base 14A, interconnect 16A and force applying mechanism 18A of the carrier 10A function substantially the same as the corresponding components previously described for carrier 10.

However, in this embodiment the base 14A also includes a lead frame 82 molded within the base 14A. The lead frame 82 include lead fingers 84 (FIG. 9) that form the internal signal traces and the terminal contacts 22C for the carrier 10A. Bond wires 70C, as previously described, electrically connect the lead fingers 84 to bond pads 53C and interconnect contacts 64 (FIG. 6A) on the interconnect 16A. In addition, the base 14A includes one or more capacitors 38A mounted to the lead frame 82 and electrically connected to selected lead fingers 84 and terminal contacts 22C.

The capacitors 38A are electrically connected to the lead fingers 84 by soldering, brazing, wire bonding or conductive adhesive bonding. In addition, the capacitors 38A can be components of an electrical circuit substantially similar to the electrical circuit 49 (FIG. 5) previously described.

The base 14A and terminal contacts 22C can have a configuration (i.e., size, peripheral outline) corresponding to that of a conventional semiconductor package. In the illustrative embodiment, the base 14A has the configuration of a small outline j-bend (SOJ) package. Alternately, the base 14A can have the configuration of other conventional packages such as single in line memory module (SIMM), dual in line package (DIP), quad flat pack (QFP), zig zag in line package (ZIP), or leadless chip carrier (LCC). This permits the carrier 10A to be utilized with conventional equipment such as burn-in boards, carrier trays, and handling equipment associated with conventional semiconductor packages.

The base 14A comprises a molded polymer formed by conventional molding processes. Exemplary polymers include epoxy novolac resin, silicone, phenylsilane and thermoset plastics. The base 14A includes channels 86 (FIG. 7) on either end for receiving the clips 80. The base 14A also includes a molded recess 88 (FIG. 8). With the pressure plate 50A attached to the base 14A the recess 88 forms an enclosed cavity 90 (FIG. 8) for the component 12 and biasing member 48A. Also, with the pressure plate 50A attached to the base 14A, the component 12 is pressed by the biasing member 48A against the interconnect 16A.

The pressure plate 50A and clips 80 are sized and shaped for mating physical engagement. In addition, the clips 80 include rectangular openings 92 (FIG. 7) which permit handling by a manual or automated tool. Preferably the clips 80 comprise a resilient metal or plastic material.

In the carrier 10A, biasing member 48A comprises a resilient elastomeric material such as silicone, butyl rubber, or fluorosilicone. If desired, the biasing member 48A can be secured to the pressure plate 50A using an adhesive such as silicone. Rather than being formed of elastomeric materials, the biasing member 48A can comprise a resilient metal such as a belleville washer, or spring segment. Alternately, the biasing member 48A can comprise a compressible gas or liquid filled bladder.

Assembly of the carrier 10A, with the component 12 therein, can be accomplished by attaching the component 12 to the pressure plate 50A and biasing member 48A. The pressure plate 50A and biasing member 48A can include a vacuum conduit 94 to enable attachment of the component 12 using a vacuum tool (not shown). The component 12 can then be aligned with the interconnect 16A and placed in contact therewith. Optical alignment techniques can be used during assembly of the carrier 10A. U.S. Pat. No. 5,541,525 entitled "CARRIER FOR TESTING AN UNPACKAGED SEMICONDUCTOR DIE", which is incorporated herein by reference, describes a method for assembling the carrier 10A using optical alignment.

Further details of the carrier 10A including methods of fabrication are disclosed in U.S. patent application Ser. No. 09/143,300 filed Aug. 28, 1998, entitled "TEST CARRIER WITH MOLDED INTERCONNECT FOR TESTING SEMICONDUCTOR COMPONENTS", which is incorporated herein by reference.

Figure 10:
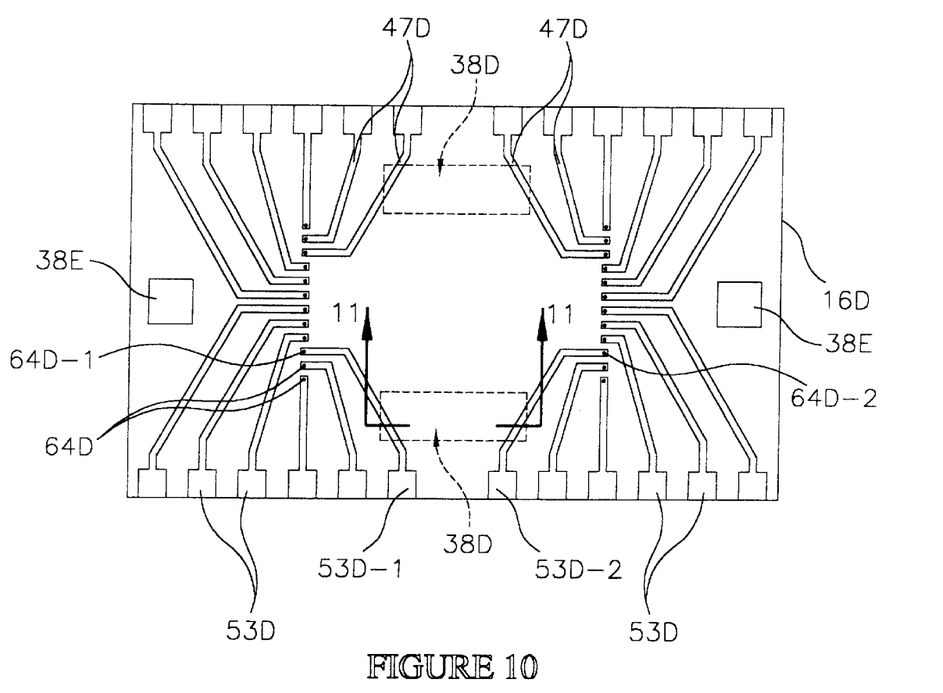
FIG. 10 is a plan view of an alternate embodiment interconnect constructed in accordance with the invention with decoupling capacitors mounted to the interconnect.
Figure 11:
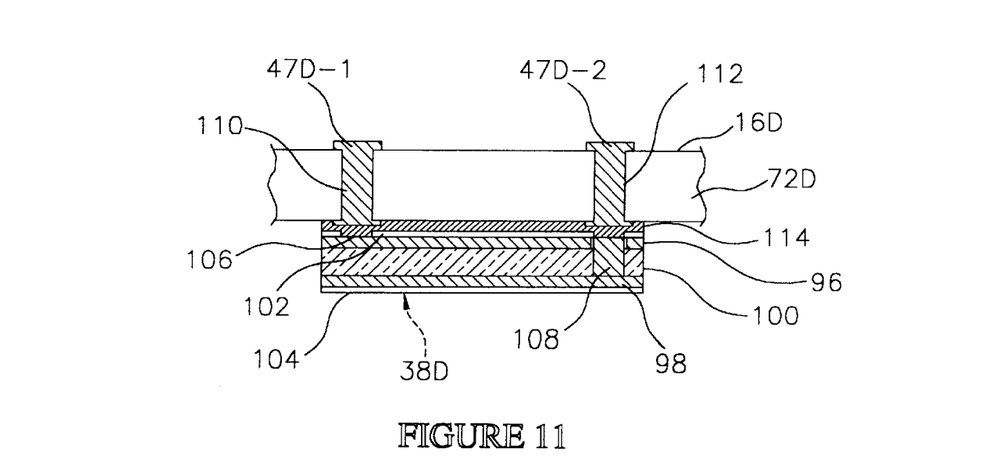
FIG. 11 is a cross sectional view taken along section line 11—11 of FIG. 10 illustrating a capacitor on the interconnect.

Referring to FIGS. 10 and 11, an alternate embodiment interconnect 16D is illustrated. The interconnect 16D functions substantially the same as the interconnects 16 (FIG. 3) and 16A (FIG. 9) previously described. In addition, the interconnect 16D mounts to a carrier (not shown) substantially equivalent to the carrier 10 (FIG. 1) or 10A (FIG. 7) previously described. However, in this embodiment decoupling capacitors 38D are mounted directly to the interconnect 16D rather than to the base of the carrier.

The interconnect 16D includes interconnect contacts 64D for establishing temporary electrical connections with the contacts 13 (FIG. 6A) on the component 12. The interconnect contacts 64D can be configured substantially the same as interconnect contacts 64 (FIG. 6A), interconnect contacts 64A (FIG. 6B) or interconnect contacts 64B (FIG. 6C). A substrate 72D (FIG. 11) of the interconnect 16D can comprise silicon, ceramic or a glass filled resin, and the interconnect contacts 64B can be formed on the substrate 72D substantially as previously described.

The interconnect 16D also includes patterns of conductors 47D formed on a surface thereof, in electrical communication with the interconnect contacts 64B. The conductors 47D function substantially the same as the conductors 47 (FIG. 6A) previously described. In addition, the interconnect 16D includes bond pads 53D in electrical communication with the conductors 47D. The bond pads 53D are configured for wire bonding to corresponding bond pads on the carrier base substantially as previously described for bond pads 53 (FIG. 6A).

As shown in FIG. 11 the decoupling capacitor 38D includes a first electrode 96 and a second electrode 98 separated by a dielectric layer 100. The capacitor 38D also includes a first insulating layer 102 formed on the first electrode 96 and a second insulating layer 104 formed on the second electrode 98. In addition, the capacitor 38D includes a first electrode contact 106 in electrical communication with the first electrode 96 and electrically insulated from the second electrode 98. The capacitor 38D also includes a second electrode contact 108 in electrical communication with the second electrode 98 and electrically insulated from the first electrode 96.

The electrodes 96, 98 of the capacitor 38D comprise conductive thin films. Preferred conductive thin films for the electrodes 96, 98 include aluminum, copper, nickel, gold and palladium/silver alloys. Barrier layers (not shown), formed of inert metals such as titanium and tungsten or alloys thereof, can also be formed between the electrodes 96, 98 and the dielectric layer 100.

The dielectric layer 16 comprises a thin film dielectric material having a desired dielectric constant. Preferred dielectric materials for the dielectric layer 16 include polymers, oxides, nitrides, ceramics or other high dielectric materials. For example, polyimide, tantalum pentoxide ($Ta_2O_5$) and polyvinylidenefluoride (PVDF) are suitable dielectric materials. Pre-formed laminates for fabricating the electrode are available from Goodfellow Corporation of PA.

As also shown in FIG. 11, the interconnect 16D includes a first conductive via 110 in electrical communication with the first electrode contact 106, and a second conductive via 112 in electrical communication with the second electrode contact 108. The conductive vias 110, 112 can comprise etched or laser vias filled with a metal or a conductive polymer. A conductive adhesive layer 114, such as a z-axis anisotropic adhesive, electrically connects the conductive vias 110, 112 on the interconnect 16D to the electrode contacts 106, 108 on the electrode 38D. The conductive adhesive layer 114 also secures the capacitor 38D to a backside of the substrate 72D of the interconnect 16D.

The first conductive via 110 is in electrical communication with a first conductor 47D-1 on the surface of the substrate 72D of the interconnect 16D. The second conductive via 112 is in electrical communication with a second conductor 47D-2 on the surface of the substrate 72D of the interconnect 16D. The conductors 47D-1, 47D-2 are also in electrical communication with bond pads 53D-1 and 53D-2 respectively on the interconnect 16D. In addition, the conductors 47D-1, 47D-2 are in electrical communication with interconnect contacts 64D-1 and 64D-2 respectively. The interconnect contacts 64D-1, 64D-2 electrically contact selected contacts 13 (FIG. 6A) on the component 12, such as ground or power contacts as previously described. The electrical path through the capacitor 38D is thus substantially similar to the electrical path through the capacitor 38 in the electrical circuit 49 of FIG. 5. In addition, the capacitor 38D functions substantially the same as the capacitor 38 (FIG. 5).

Alternately, as also shown in FIG. 10, one or more capacitors 38E can be surface mounted to the interconnect 16D. In this case the capacitors 38E can be soldered or adhesively bonded, to selected conductors 47D on the interconnect 16D, substantially as shown in FIG. 4D. Alternately, the capacitors 38E can be wire bonded or TAB bonded to selected conductors 47D on the interconnect 16D, substantially as shown in FIG. 4D.

Figure 12:
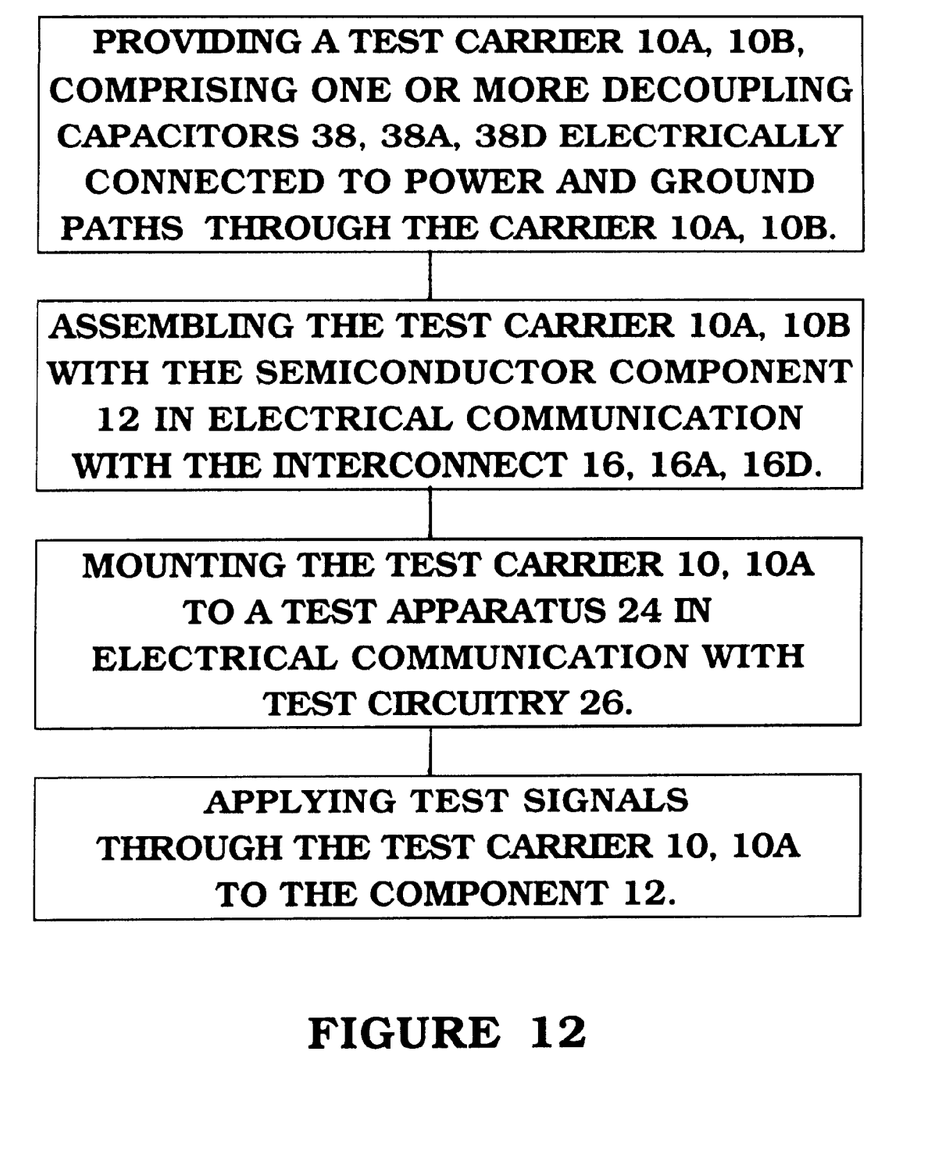
FIG. 12 is a block diagram of broad steps in a test method performed in accordance with the invention.

Referring to FIG. 12, broad steps in the method for testing the components 12 using the carrier 10, 10A are illustrated as follows.

1. Providing a test carrier 10A, 10B, comprising a decoupling capacitor 38, 38A, 38D electrically connected to power and ground paths through the carrier 10A, 10B.

The decoupling capacitor 38, 38A, 38D can be mounted to a base 14, 14A, or to an interconnect 16, 16A, 16D of the carrier 10A, 10B. In either case the electrodes of the capacitor 38, 38A, 38D are in electrical communication with selected interconnect contacts 64, and with selected terminal contacts 22 on the carrier 10A, 10B.

2. Assembling the test carrier 10A, 10B with the semiconductor component 12 in electrical communication with the interconnect 16, 16A, 16D.

During assembly of the carrier 10A, 10B alignment of the external contacts 13 on the component 12 to the interconnect contacts 64 can be performed using optical alignment techniques or using an alignment member 45. In addition, in the assembled test carrier 10A, 10B, the force applying mechanism 18, 18A biases the component 12 against the interconnect 16, 16A, 16D.

3. Mounting the test carrier 10, 10A to a test apparatus 24 in electrical communication with test circuitry 26.

The test apparatus 24 includes electrical connectors adapted for mating electrical engagement with the terminal contacts 22 on the test carrier 10, 10A.

4. Applying test signals through the test carrier 10, 10A to the component 12.

During applying of the test signals, parasitic inductance, noise and power supply modulation are substantially reduced by the operation of the decoupling capacitors 38, 38A, 38D. For example, test signals transmitted to power external contacts 13Vcc for the component 12 are filtered by the decoupling capacitors 38, 38A, 38D. Noise and power spikes can thus be shunted by the decoupling capacitors 38, 38A, 38D to ground external contacts 13Vss. This improves the test process particularly at high signal frequencies.

Thus the invention provides an improved semiconductor carrier including decoupling capacitors mounted to a base or interconnect of the carrier. Also provided is a method for testing semiconductor components using the carrier, and a test system incorporating the carrier. Although the invention has been described with reference to certain preferred embodiments, as will be apparent to those skilled in the art, certain changes and modifications can be made without departing from the scope of the invention, as defined by the following claims.

We claim:

1. A test carrier for a semiconductor component comprising:
   a base comprising a recess;
   an interconnect on the base comprising a first contact and a second contact for electrically engaging a first external contact and a second external contact on the component;
   a capacitor in the recess comprising a first electrode electrically connected to the first contact, and a second electrode electrically connected to the second contact; and
   an encapsulant in the recess at least partially encapsulating the capacitor.

2. The test carrier of claim 1 wherein the capacitor comprises a thin film capacitor.

3. The test carrier of claim 1 wherein the interconnect is placed on the encapsulant.

4. The test carrier of claim 1 wherein the encapsulant comprises a material selected from the group consisting of epoxy, polyimide and room temperature vulcanizing material.

5. The test carrier of claim 1 wherein the first external contact comprises a power contact and the second external contact comprise a ground contact.

6. A test carrier for a semiconductor component comprising:
   a base comprising a recess, a plurality of terminal contacts for electrically engaging a test apparatus and a plurality of capacitor contacts in electrical communication with selected terminal contacts;
   an interconnect on the base comprising a plurality of interconnect contacts in electrical communication with the capacitor contacts for electrically engaging external contacts on the component; and
   a thin film capacitor in the recess comprising a plurality of electrodes electrically connected to the capacitor contacts and contained in an electrical path between at least one terminal contact and at least one interconnect contact.

7. The test carrier of claim 6 wherein the at least one terminal contact comprises a power contact or a ground contact.

8. The test carrier of claim 6 wherein the component comprises a semiconductor die or a semiconductor package.

9. The test carrier of claim 6 wherein the component comprises a semiconductor chip scale package.

10. The test carrier of claim 6 wherein the capacitor is bonded to the capacitor contacts.

11. The test carrier of claim 6 further comprising an encapsulant in the recess at least partially encapsulating the capacitor.

12. A test carrier for a semiconductor component comprising:
    a base for holding the component comprising a first terminal contact and a second terminal contact for electrically engaging a test apparatus;
    a socket on the base comprising a first capacitor contact in electrical communication with the first terminal contact and a second capacitor contact in electrical communication with the second terminal contact;
    an interconnect on the base comprising a first interconnect contact in electrical communication with the first capacitor contact on the base for electrically engaging a first external contact on the component, and a second interconnect contact in electrical communication with the second capacitor contact on the base for electrically engaging a second external contact on the component; and
    a capacitor on the socket comprising a first electrode electrically engaged by the first capacitor contact on the socket, and a second electrode electrically engaged by the second capacitor contact on the socket;
    the socket configured for use with different types of capacitors for reconfiguring the base for testing different types of components.

13. The test carrier of claim 12 wherein the first capacitor contact and the second capacitor contact comprise receptacles for the first electrode and the second electrode.

14. A test carrier for a semiconductor component comprising:
    a base;
    an interconnect on the base comprising a first contact and a second contact for electrically engaging a first external contact and a second external contact on the component;
    a lead frame molded to the base comprising a first lead finger and a second lead finger in electrical communication with the first contact and the second contact on the interconnect; and
    a capacitor attached to the lead frame and molded to the base, the capacitor comprising a first electrode electrically connected to the first lead finger, and a second electrode electrically connected to the second lead finger.

15. The test carrier of claim 14 wherein the capacitor comprises a thin film capacitor.

16. The test carrier of claim 14 wherein the first lead finger and the second lead finger comprise terminal contacts for the carrier.

17. The test carrier of claim 14 wherein the interconnect is molded to the base.

18. A test carrier for a semiconductor component comprising:
    a base comprising a first terminal contact and a second terminal contact configured for electrical communication with a test apparatus;
    an interconnect on the base comprising a first contact and a second contact for making temporary electrical connections with a first external contact and a second external contact on the component; and a thin film capacitor attached to the interconnect comprising a first electrode electrically connected to the first terminal contact and to the first contact, and a second electrode electrically connected to the second terminal contact and to the second contact.

19. The test carrier of claim 18 wherein the capacitor is bonded to a backside of the interconnect.

20. The test carrier of claim 18 wherein the capacitor is bonded to the interconnect using a conductive adhesive.

21. A method for testing a semiconductor component comprising:

providing a carrier for packaging the component, the carrier comprising a base having a recess, a contact on the base for electrically engaging an external contact on the component and a thin film capacitor in the recess at least partially encapsulated in an encapsulant and electrically connected to the contact;

assembling the carrier with the contact on the base in electrical communication with the external contact on the component;

applying test signals through the contact on the base and the capacitor to the external contact on the component with the capacitor reducing parasitic inductance and power supply noise.

22. The method of claim 21 wherein the encapsulant comprises a cured polymer.

23. The method of claim 21 wherein the encapsulant comprises a material selected from the group consisting of epoxy, polyimide and room temperature vulcanizing material.

24. The method of claim 22 wherein the contact comprises an interconnect mounted to the carrier.

25. The method of claim 22 wherein the component comprises a semiconductor die or a semiconductor package.

26. A method for testing a semiconductor component comprising:

providing a carrier for packaging the component, the carrier comprising a base, an interconnect on the base comprising a first contact and a second contact, a lead frame molded to the base comprising a first lead finger in electrical communication with the first contact and a second lead finger in electrical communication with the second contact, a capacitor attached to the lead frame and electrically connected to the first lead finger and the second lead finger;

assembling the carrier with the component in electrical communication with the first contact and the second contact on the interconnect;

applying test signals through the first lead finger, the second lead finger, the capacitor, the first contact and the second contact to the component.

27. The method of claim 26 wherein the component comprises a semiconductor die or a semiconductor package.

28. The method of claim 26 wherein the interconnect is molded to the base.

29. A method for testing a semiconductor component comprising:

providing a carrier for holding the component, the carrier comprising an interconnect comprising a plurality of first contacts for making temporary electrical connections with a plurality of second contacts on the component, and a thin film capacitor on the interconnect in electrical communication with selected first contacts on the interconnect;

placing the component on the carrier with the first contacts on the interconnect in electrical communication with the second contacts on the component;

applying test signals through the capacitor, the first contacts on the interconnect, and the second contacts on the component.

30. The method of claim 29 wherein the capacitor is bonded to a backside of the interconnect.

31. A method for testing a semiconductor component comprising:

providing a carrier for packaging the component, the carrier comprising:

a base comprising a first terminal contact and a second terminal contact for electrically engaging a test apparatus;

a socket on the base comprising a first capacitor contact in electrical communication with the first terminal contact and a second capacitor contact in electrical communication with the second terminal contact;

an interconnect on the base comprising a first contact in electrical communication with the first capacitor contact and a second contact in electrical communication with the second capacitor contact, the first contact and the second contact configured to electrically engage a first external contact and a second external contact on the component;

a capacitor on the socket comprising a first electrode electrically engaged by the first capacitor contact on the socket and a second electrode electrically engaged by the second capacitor contact on the socket;

the socket configured for use with different types of capacitors for reconfiguring the base for testing different types of components;

placing the component in the carrier with the first contact and the second contact on the interconnect electrically engaging the first external contact and the second external contact on the component;

placing the first terminal contact and the second terminal contact on the carrier in electrical communication with test circuitry;

applying test signals through the first terminal contact, the second terminal contact, the first contact, the second contact, the first electrode, the second electrode, the capacitor, the first external contact and the second external contact to the component.

32. The method of claim 31 wherein the first external contact comprises a power contact and the second external contact comprises a ground contact.

33. The method of claim 31 wherein the first capacitor contact and the second capacitor contact comprise receptacles for the first electrode and the second electrode.

34. A test system for testing a semiconductor component comprising:

a test circuitry configured to apply test signals to the component;

a test apparatus in electrical communication with the test circuitry; and a carrier configured to package and electrically connect the component to the test circuitry, the carrier comprising a base having a recess, a contact on the base for electrically engaging an external contact on the component and a thin film capacitor in the recess at least partially encapsulated in an encapsulant and electrically connected to the contact;

the capacitor configured to reduce parasitic inductance and power supply noise during testing of the component using the carrier.

35. The system of claim 34 wherein the encapsulant comprises a cured polymer.

36. The system of claim 34 wherein the encapsulant comprises a material selected from the group consisting of epoxy, polyimide and room temperature vulcanizing material.

37. The system of claim 34 wherein the component comprises a semiconductor die or a semiconductor package.

38. The system of claim 34 wherein the component comprises a semiconductor chip scale package.

39. A test system for testing a semiconductor component comprising:
- a test apparatus in electrical communication with test circuitry for applying test signals to the component; and
- a carrier configured to package and electrically connect the component to the test circuitry, the carrier comprising:
  - a base comprising a first terminal contact and a second terminal contact for electrically engaging the test apparatus;
  - a lead frame molded to the base comprising a first lead finger and a second lead finger in electrical communication with the first terminal contact and the second terminal contact;
  - an interconnect on the base comprising a first contact in electrical communication with the first lead finger for electrically engaging a first external contact on the component and a second contact in electrical communication with the second lead finger for electrically engaging a second external contact on the component; and
  - a capacitor attached to the lead frame comprising a first electrode electrically connected to the first lead finger, and a second electrode electrically connected to the second lead finger.

40. The system of claim 39 wherein the capacitor comprises a thin film capacitor.

41. The system of claim 39 wherein the first external contact comprises a power contact for the component and the second external contact comprises a ground contact for the component.

* * * * *